United States Patent [19]

Shiraishi

[11] Patent Number: 5,685,006
[45] Date of Patent: Nov. 4, 1997

[54] APPLICATION SPECIFIC INTEGRATED CIRCUIT HAVING HIERARCHICAL STRUCTURE AND METHOD OF ORGANIZING SUCH CIRCUIT USING INHERITANCE INFORMATION

[75] Inventor: Hajime Shiraishi, Tokyo-to, Japan

[73] Assignee: Kabushiki Kaisha Toshiba, Kawasaki, Japan

[21] Appl. No.: 365,009

[22] Filed: Dec. 28, 1994

[30] Foreign Application Priority Data

Dec. 28, 1993 [JP] Japan .................................. 5-353884

[51] Int. Cl.⁶ .......................... G06F 13/38; G06F 13/20
[52] U.S. Cl. ................... 395/800; 395/441; 395/449; 364/DIG. 1; 364/DIG. 2; 364/489
[58] Field of Search ........................... 395/650, 883, 395/848, 833, 800, 375, 500, 388, 200.01, 750, 7 R, 200.05, 300, 200.06, 309, 619, 441, 671, 449; 348/559; 370/13; 364/DIG. 1, DIG. 2, 489, 488, 578; 340/825.83

[56] References Cited

U.S. PATENT DOCUMENTS

| | | | |
|---|---|---|---|
| 4,901,225 | 2/1990 | Shiraishi | 395/388 |
| 5,111,388 | 5/1992 | Shiraishi | 395/800 |
| 5,159,689 | 10/1992 | Shiraishi | 395/800 |
| 5,400,262 | 3/1995 | Mohsen | 364/489 |
| 5,414,707 | 5/1995 | Johnston et al. | 370/58.1 |
| 5,426,769 | 6/1995 | Pawloski | 395/500 |

*Primary Examiner*—Daniel H. Pan
*Attorney, Agent, or Firm*—Oblon, Spivak, McClelland, Maier & Neustadt, P.C.

[57] ABSTRACT

An application specific integrated circuit which can develop a wide variety of integrated circuits in a short time period is provided. In respective functional blocks, inheritance circuits capable of holding and transferring function inheritance information necessary for univocally specifying functions of respective corresponding functional blocks, bearer switches serving as a data transfer switch, and program wiring mechanisms are provided. After a mother wafer on which such units are hierarchically connected by function inheritance information read-out buses is manufactured, function inheritance information is read out to obtain, on the basis of the read out information, information for connecting partial circuit groups within block having one-to-one correspondence with respect to that information to drive programmable wiring mechanisms by using such information, thus to obtain connections as defined be the system requirement specification.

6 Claims, 10 Drawing Sheets

APPLICATION SPECIFIC INTEGRATED CIRCUIT HAVING HIERARCHICAL STRUCTURE AND METHOD OF ORGANIZING SUCH CIRCUIT USING INHERITANCE INFORMATION

BACKGROUND OF THE INVENTION

1. Field of the Invention

This invention relates to an ASIC (Application Specific IC) chip which is an application specific integrated circuit and an organizing method, and such ASIC chip is particularly suitable to an application specific standard product microcontroller.

2. Description of the Prior Art

In order to organize (construct) Application Specific Integrated Circuit (ASIC) constituted with combination of standard CPU and peripheral input/output circuit libraries according to customer's request, four techniques as described below are conventionally proposed.

The first technique is a gate array technique. This technique is one of circuit organizing method for ASIC in a narrow sense, and is already widely popularized.

In accordance with the gate array technique, as shown in FIG. 11, a wafer (mother wafer) in which gate arrangement/wiring areas 2 where a large number of fundamental gates are arranged in line are formed in advance, or input/output buffer gates 3 are further arranged at the peripheral portion thereof in corresponding with input/output pins (bonding pads) 4 is first manufactured. Customer carries out logical design and verification by himself on the basks of the specification of specific application to input verified correct logic circuit diagram into CAD to obtain gates and their connection information (NET LIST) to supplement wiring process such as aluminum vacuum deposition, etc. to the mother wafer where gates are assembled by using the connection information to finish up (personalize) it into application specific product.

In the case of the gate array technique, while It is true that since specification can be determined only by the personalize process of mother wafer, there is the merit that ASIC can be certainly trial manufactured in a short time period, customer is required to entirely carry out all logical design/verification works, resulting in the fact that there are many works before request for development is made to maker. Particularly, in a large system of ten thousand gates or more, quantity of works of pre-process becomes vast. Followed by this, test specification and/or preparation of test data extremely becomes complicated. From such actual circumstances, there are drawbacks that development cost is increased and term of design is elongated.

The second technique is a technique using the standard cell. This technique is also one of circuit organizing method for ASIC in a narrow sense, and is already popularized.

In accordance with this technique, as shown in FIG. 12, logical design and its verification of standard cell library registered in advance are carried out on the basis of specification of specific application in the form of blocks 11 to 15 to input the verified logic circuit diagram into CAD to obtain connection information in arrangement of standard cells and wiring channels 16 between blocks, thus to design of masks of the total process.

In the case of such standard cells, since only necessary gates are arranged by the development work, there is no unused gate end the chip size can be smaller than that of gate array, resulting in the merit from a viewpoint of cost. To the contrary, development term for LSIs becomes longer than that of the gate array technique, and customer's development cost becomes vast. In addition, the gate arrays and standard cells are both designed (made up) on the basis of 74 series by Texas Instrument Inc. which is the standard logic IC. Accordingly, there is also the problem that re-utilization of standard MPU core and/or peripheral IC which have actual results cannot be made.

The third technique is a circuit organizing method as shown in FIG. 13 in which microprocessor (MPU) 21, serial input/output circuit (SIO) 22, parallel input/output circuit (PIO) 23, timer/counter 24, DMA (Direct Memory Access) 25, AD/C (Analog to Digital Converter) 26, CG (Clock Generator) 27, etc. are collectively assembled as one chip as combined product suitable for the field of application equipment from a large number of standard LSIs that customers used as existing (manufactured) chips. This method re-utilizes mask patterns of existing chips as they are in principle, and is also called Super Integration (SI).

In accordance with this technique, while there is the merit that microprocessor cores and/or peripheral ICs which have actual results can be re-utilized, since mask patterns are simply connected, there are instances where characteristic of respective chip portions are not in correspondence with each other so that they are unable to be operative, or expected performance cannot be obtained. In actual terms, there is high possibility that timings of address bus, data bus and control bus may be in correspondence with each other. For example, AC characteristic such as pulse waveform or delay time, etc. in the case where existing chips are externally connected and that in the case where mask patterns are connected so that one chip is provide may be somewhat different from each other.

Further, since existing chips are diverted, matching between characteristics every respective blocks, and/or simulation model at CAD (Computer Aided Design) are not prepared. Thus, measure would be taken every derivative parts. As a result, there is a tendency such that LSI development term may be elongated. In addition, there are also the drawback that there a lacking in flexibility for specific application because this technique is not methodical circuit organizing method.

The fourth technique is a method as shown in FIG. 14 in which CPUs are arranged so that they are of hierarchical (layered) structure to down-load specific information to RAM of lower order every respective levels. For example, common memory 35 and common peripheral circuit 36 are connected to host CPU 31 through common bus 34, CPU 32 of the second level is connected thereto, and CPU 33 of the third level is further connected to the CPU 32 through bus. Additionally, local memory 37 is connected to CPU 32 of the second level, and local memory 38 and peripheral circuit 39 are connected to the bus at the third level. In such a hierarchical structure system, peculiar functions are down-loaded onto respective layers (levels) from common memory 35 along with program to allow local memories of respective layers to store to cause CPUs of respective layers to execute them.

The inventor of this application has proposed various new techniques and some of them have been approved as three U.S. Pat. Nos. 4,901,225, 5,111,388 and 5,159,689. In these patents, the inventor proposed, in hierarchical structure, system of machine instructions, effective allocation of machine instructions and different operation in different levels.

With the technique used in FIG. 14, however, since there is no dedicated peripheral circuit, processing efficiency is poor. Further, since specific information take the form of program or data, it is unable to protect such information from unexpected breakdown in work. In addition, there is the problem that since there is employed a structure comprised of multistage of systems including CPU as center, it is difficult to realize implementation of one chip.

Under present circumstances, development requests of a wide variety of application specific LSIs required to be done in a short term from customers are still more increasing in future. Moreover, there are circumstances where according as systems become complicated, microprocessors, peripheral circuits and memories are mounted in a mixed state. However, the conventional circuit organizing methods have drawbacks and problems as described above, and are therefore all in unsatisfactory circumstances. In addition, development engineers are insufficient on both customers and makers sides. Accordingly, the technologies conventionally proposed cannot sufficiently cope with the above-mentioned requirements under present situations.

SUMMARY OF THE INVENTION

With the above in view, an object of this invention is to provide an application specific integrated circuit by a new technique which can develop a wide variety of integrated circuits in a short time period.

According one aspect of the present invention, there is provided an application specific integrated circuit comprising:

a plurality of functional blocks;

inheritance circuits provided every functional blocks, the inheritance circuit being operative to selectively transfer function inheritance information of a functional block of lower order to which data is transferred from the functional block of the lower order or function inheritance information of a corresponding functional block with respect to functional inheritance information required for univocally specifying functions of the functional blocks;

inheritance buses adapted to connect the inheritance circuits in a manner of hierarchical structure to thereby function inheritance information of an arbitrary functional block;

data transfer switch means provided at respective functional blocks and adapted for generating connections of data buses and bus control signal lines between functional blocks of lower and higher orders; and programmable wiring mechanisms for determining the number of repeat times at functional block portion circuits and wirings between these internal circuits, the functional blocks and the data transfer switch means on the basis of the function inheritance information and request system configuration information inputted from the external.

According to another aspect of the present invention, there is provided a method of organizing an application specific integrated circuit comprising the process steps of:

obtaining function inheritance information consisting of external functions and internal circuit configuration templates of MPU cores or peripheral input/output controller function blocks verified by the existing design to provide inheritance circuits fixed in ROMs;

assembling the inheritance circuits through inheritance buses on the basis of a system requirement specification so that they are of a necessary hierarchical structure;

disposing, at necessary portions, data transfer switch means for generating paths for main data and control signals passing from external input terminal groups to external output terminal groups through respective blocks for executing the system requirement specification;

preparing programmable wiring mechanisms for forming their detailed connection points by the number corresponding to all terminals where connection can be made;

disposing all the circuits prepared by the above-described process steps to manufacture a mother wafer;

reading out function inheritance information from the respective inheritance circuits through inheritance buses;

taking out intra-block circuit connection information from a library of a registered functional block corresponding to the read out function inheritance information;

determining the number of repeats of constituent partial circuits by using the system requirement specification and block internal configuration template information included in function inheritance information of respective corresponding functional blocks;

converting information obtained at the process steps into wiring connection information with respect to the programmable wiring mechanisms;

connecting, at necessary portions, elements serving as connection points assembled in the programmable wiring mechanisms by using the converted wiring connection information; and employing a necessary number of bus protocol conversion circuits for carrying out conversion into standard bus protocol in the case where bus accessing systems and/or timings of respective blocks existing in the functional block library do not coincide with each other.

In accordance with the application specific integrated circuit according to this invention, there are provided, at respective functional blocks, inheritance circuits capable of holding and transferring function inheritance information necessary for univocally specifying functions of those functional blocks, data transfer switch means, and program wiring mechanisms. In such application specific integrated circuit, after mother wafer in which the above-described respective constituent units are hierarchically connected by inheritance buses is manufactured, function inheritance information is read out to obtain, on the basis of the read out information, information for connecting partial circuit groups within block having one-to-one correspondence with respect to that information to drive programmable wiring mechanisms by using such information to provide connections as defined by the system requirement specification. For this reason, wide variety of integrated circuits can be developed in a short time period.

DESCRIPTION OF THE PREFERRED EMBODIMENT

A preferred embodiment of this invention will now be described by taking the case of application specific standard product microcontroller circuit as an example.

Figure 1:
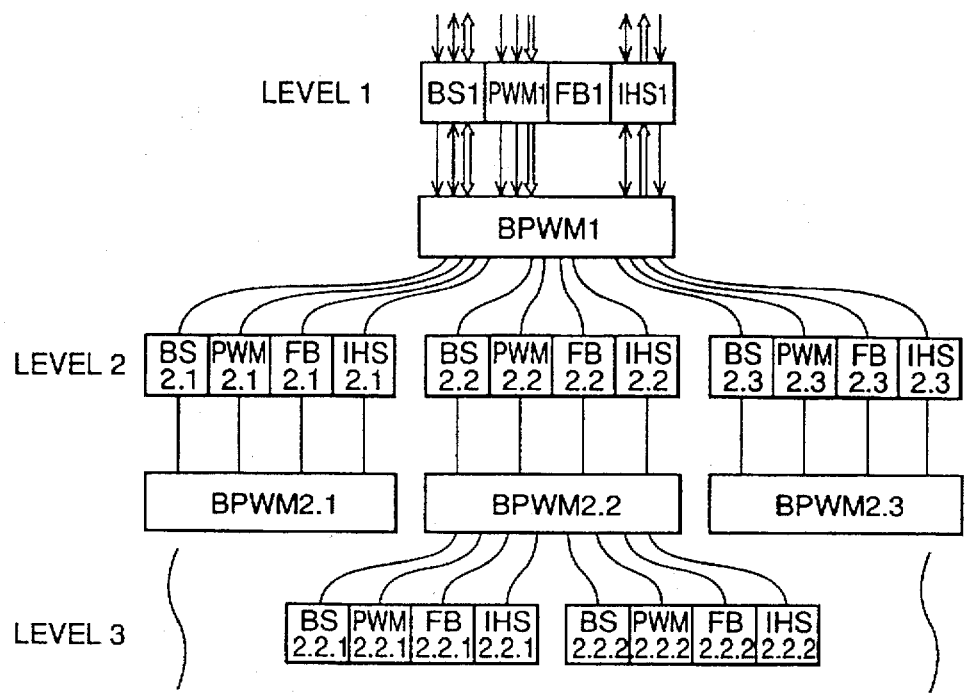
FIG. 1 is a block diagram showing the entire configuration of chip of anapplication specific integrated circuit according to this invention.

FIG. 1 is a block diagram showing the configuration of the entirety in an application specific integrated circuit according to this invention.

As seen from this figure, bearers switches BS, programmable wiring generation circuits PWM, function blocks FB, and inheritance circuits IHS are provided so that they are of hierarchical (layered) structure. Respective levels (layers) are connected through inter-block wiring generation programmable wiring mechanisms BPWM. For example, bearer switch BS1, programmable wiring generation control circuit PWM1, functional block FB1 and inheritance circuit IHS1 of level 1 are connected, through inter-block wiring generation programmable wiring mechanisms BPWM1, to circuit organizing means composed of bearer switch BS2.1, programmable wiring generating control circuit PWM2.1, functional block FB2.1, and inheritance circuit IHS2.1, circuit organizing means composed of bearer switch BS2.2, programmable wiring generation control circuit PWM2.2, functional block FB2.2 and inheritance circuit IHS2.2, and circuit organizing means composed of bearer switch BS2.3, programmable wiring generation control circuit PWM2.3, functional block FB2.3 and inheritance circuit IHS2.3.

These circuit organizing means are connected to circuit organizing means of lower layer through inter-block wiring generation programmable wiring mechanisms BPWM2.1, 2.2, 2.3.

Figure 2:
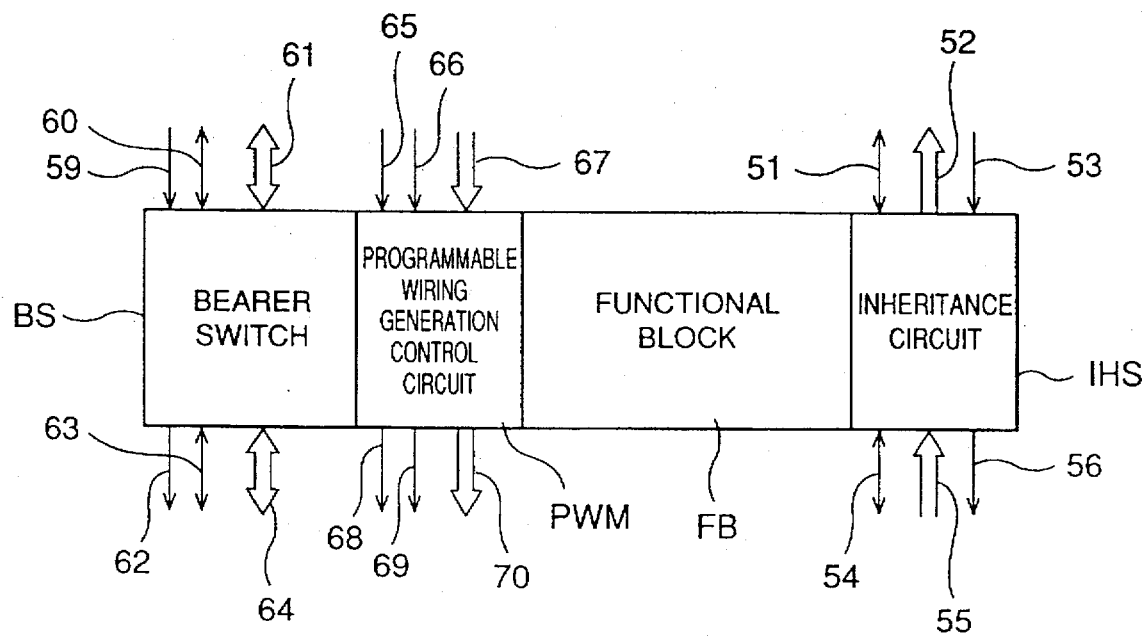
FIG. 2 is an explanatory view showing one unit of circuit organizinging means.

The detail of the circuit organizing means is shown in FIG. 2. As previously described, circuit organizing means of one unit consists of four sections.

Initially, there is provided functional block FB which is functional block body portion to be executed as the first section. This functional block FB is further divided into circuit cell groups, wiring channels, connection point element groups, etc. When occasion demands, functional block FB may include partial circuit groups to which fixed wiring has been already implemented.

Adjacently to the function block FB, inheritance circuit IHS dedicated to that functional block is provided as the second section. This circuit holds function inheritance information (inheritance information) representing function inherent in functional block.

Here, inherent function refers to function in which action of corresponding circuit is univocally specified. For example, in the case of DMA (Direct Memory Access), the inherent function is a function to continuously transfer by itself data on the memory to designated I/O unit through external bus of processor without assistance of processor. In the case of DMA, in order to exhibit this inherent function, it is necessary to request processor to open bus to receive acknowledge of opening of bus from the processor. If data trans for source address, data transfer destination address and transfer byte number (quantity) are designated on the premise of the above-mentioned inherent function, DMA is defined, thus making it possible to carry out transfer of data by DMA.

To the inheritance circuit IHS, read-out control signal line 51 for transferring read-out control signal between corresponding block and higher order block, function inheritance information read-out bus 52 for transferring function inheritance information to higher order block, block call line 53 for transferring block call code from higher order block, read-out control signal line 54 for transferring read-out control signal between corresponding block and lower order block, function inheritance information read-out bus 55 for transferring function inheritance information from lower order block, and block call line 56 for transferring block call code to lower order block are connected.

Figure 3:
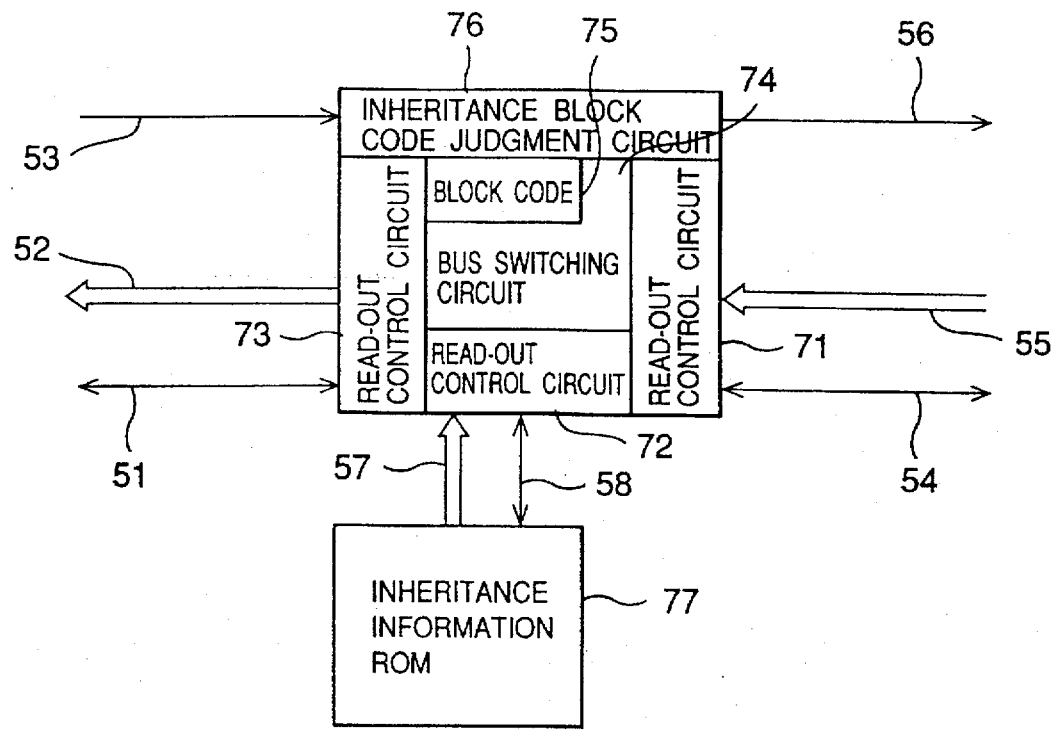
FIG. 3 is a circuit block diagram showing an example of an inheritance circuit block.

The detailed configuration of the inheritance circuit IHS is shown in FIG. 3. This circuit includes three read-out control circuits. Function inheritance information transferred by function inheritance information read-out bus 55 from lower order block is read out by read-out control circuit 71. Read-out control circuit 72 reads out, by function inheritance information read-out bus 57, function inheritance information from function inheritance information ROM 77 for storing function inheritance information inherent in that functional block. Block call code from higher order block is compared with block code inherent in corresponding functional block FB read out from block code memory means 75 by inheritance block code judgment circuit 76. When the corresponding block is called, inherent function inheritance information read out from ROM is outputted to function inheritance information read-out bus 52 through read-out control circuit by bus switching circuit 74.

When block code indicates block of lower order, bus switching circuit 74 selects read-out control 71 side to transfer function inheritance information from lower order block from read-out control circuit 73 to higher order block.

Because function inheritance information represents function dedicated to corresponding block, it is univocally defined. Accordingly, as previously described, in order to protect such information from being erroneously broken by rewrite operation, this information is completely fixed and stored in function inheritance information ROM 77 dedicated to read-out. It is to be noted that in the case where information quantity is small, fixed memory circuit such as PLA, etc. may be selectively used as function inheritance information memory means. Since such fixed memory means has higher read-out speed, performance is also high.

Figure 4:
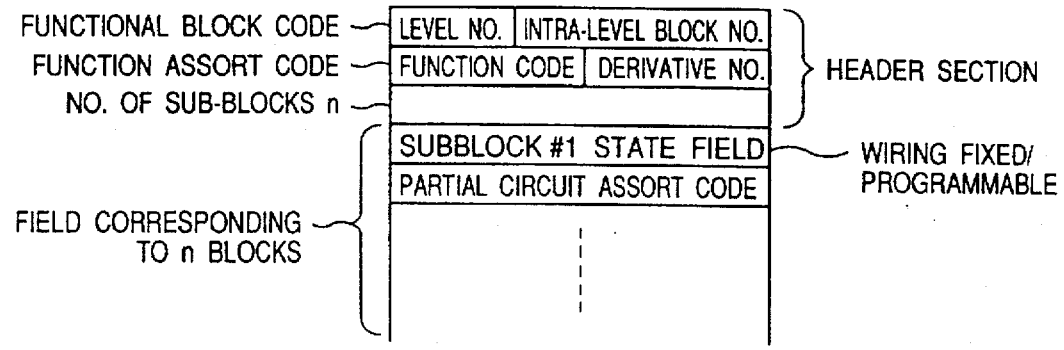
FIG. 4 is an explanatory view showing an example of definition of function inheritance information.

FIG. 4 shows the detail of function inheritance information stored in function inheritance information ROM.

Function inheritance information consists of header section indicating external specification of corresponding functional block, and sub block field arrangement indicating internal configuration.

The header section consists of functional block code, function assort (kind) code and No. of sub-blocks.

The function block code is necessary for arrangement within chip, wiring and discrimination of system hierarchical structure, and consists of level No. and block No. within level (labeled inter-level block No.). The function assort code consists of function code indicating kind of function block necessary for ASIC microcomputer configuration, e.g., CG (Clock Generator), PIC, DMA (Direct Memory Access) controller, SIO (Serial Input/Output), PIO (Parallel Input/Output), CTC, A/DC (Analog to Digital Converter), D/AC (Digital to Analog Converter), LED (Light Emitting Diode) driver, LCD (Liquid Crystal Display) driver, HDC (Hard Disk Controller), FDDC (Floppy Disk Drive Controller), TPH driver, DTMF generator, MPU (Micro Processor Unit) core, ROM (Read Only Memory), RAM (Random Access Memory), register file, etc., and derivative No. indicating specific actual function block, e.g., 4 channel DMA, etc. Moreover, sub-block field includes field indicating whether wiring is fixed or programmable and partial circuit assort code.

Accordingly, such function inheritance information univocally and completely indicates external specification and/or circuit configuration and/or connection information inherent in functional block although it is minimum.

As the second section of the circuit architecture means, bearer switch BS is provided in order to deliver data and control signal used in corresponding functional block and to pass them to lower order block.

To the bearer switch BS, block code line 59 through which block code from higher order block is transferred, bus control signal line 60 for transferring bus control signal between corresponding block and higher order block, data bus 61 for transferring data between the corresponding block and higher order block, block code line 62 for transferring block code to lower order block, bus control signal line 63 for transferring bus control signal between the corresponding block and lower order block, and data bus 64 for transferring data between the corresponding block and lower order block.

Figure 5:
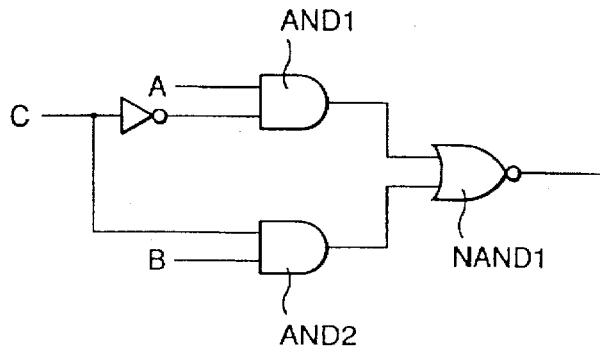
FIG. 5 is a block diagram showing an example of bearer switch BS.

An example of bearer switch BS is shown in FIG. 5. This circuit comprises two AND gates AND1 and AND2 respectively supplied at one sides thereof with two inputs A, B and NAND gate NAND1 supplied with these outputs, wherein control signal and its inverted signal /C (/ indicates inversion hereafter) are respectively inputted to the other sides of two AND gates AND1 and AND2. Accordingly, it is possible to output either input A or B by control signal C.

Further, as the third section of the circuit organizing means, there is provided programmable wiring generation control circuit PWM for generating wiring within corresponding functional block FB. To the programmable wiring generation control circuit PWM, block code line 65 through which block code from higher order block is transferred, write control signal line 66 for transferring write control signal from higher order block, wiring generation data bus 67 for transferring wiring generation data from higher order block, block code lane 68 for transferring block code to lower order block, write control signal line 69 for transferring write control signal to lower order block, and wiring generation data bus 70 for transferring lower order wiring generation data to lower order block are connected.

Figure 6:
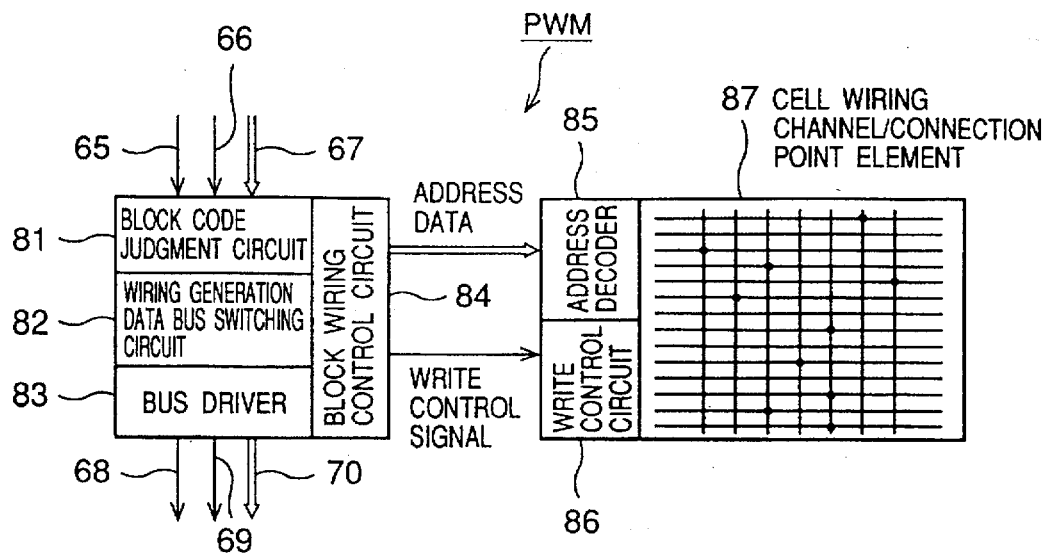
FIG. 6 is a circuit block diagram showing an example mechanism for generating wiring within block.
Figure 7:
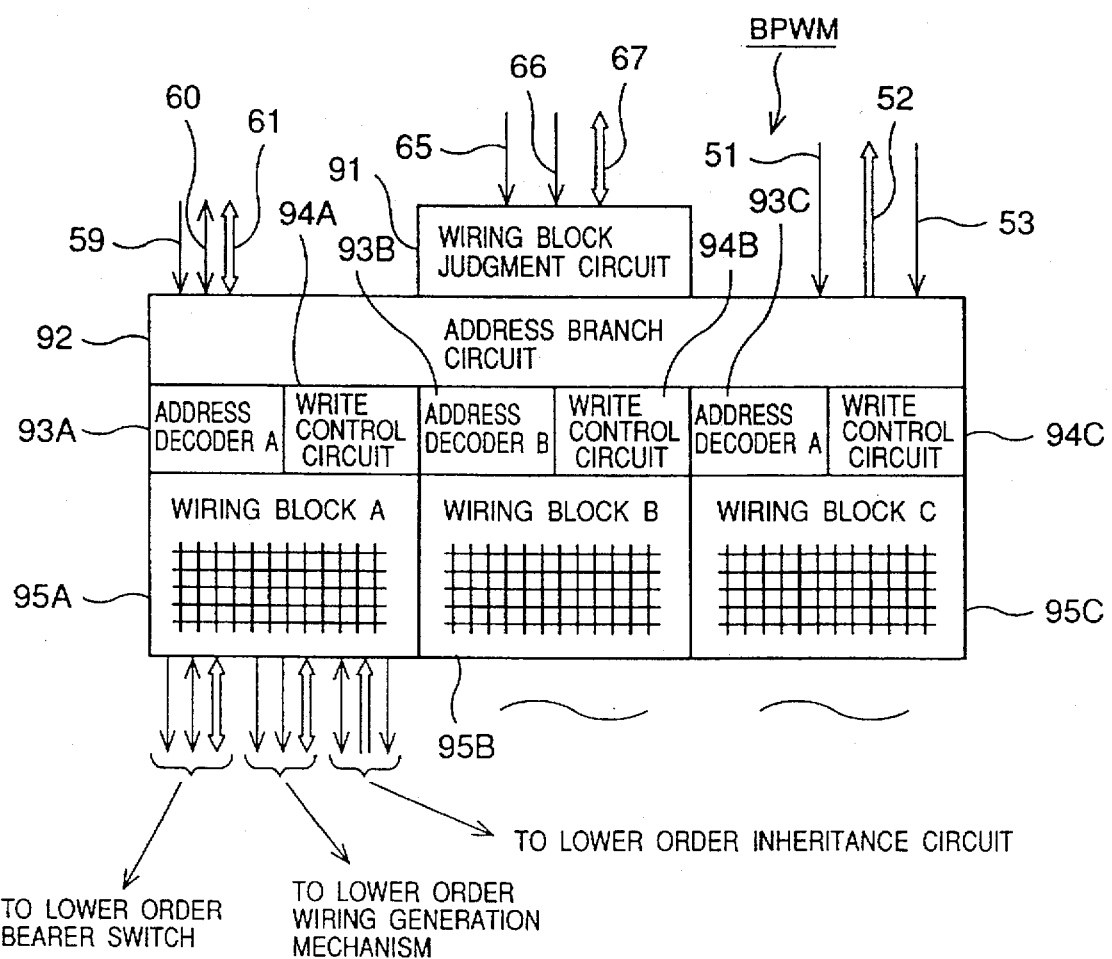
FIG. 7 is a circuit block diagram showing an example of mechanism for generating wiring between blocks.

Example of programmable wiring mechanism is shown in FIGS. 6 and 7. FIG. 6 shows intra-block wiring generation mechanism and FIG. 7 shows inter-block wiring generation mechanism.

The intra-block wiring generation mechanism PWM comprises a block code judgment circuit 81 for judging whether given block code is code for corresponding functional block, inter-block or lower order block, bus switching circuit 82 for carrying out switching between bus for intra-block wiring generation data and bus for others on the basis of judgment result of the block code judgment circuit, block wiring control circuit 84 for generating wiring in the case of wiring generation data of corresponding block, bus driver 83 for providing access to lower order block in the case where block code is code for lower order block, and the portion for generating actual wiring. This wiring generating portion includes write control circuit 86 operative in response to write control signal from block control circuit, and cell wiring channel/connection point element 87 for forming connection point caused to undergo addressing in accordance with write command.

While connection point element employing FPGA (Field Programmable Gate Array) technique having programmable internal logic block is preferable as connection point element, connection point element is not particularly limited to such connection point element.

The inter-block wiring generation mechanism BPWM comprises wiring block judgment circuit 91 for judging block code inputted thereto, and bus branching circuit 92 for designating corresponding wiring blocks 95A, 95B, 95C by judgment result at the wiring block judgment circuit to drive them through address decoders 93A, 93B, 93C and connection point write control circuits 94A, 94B, 94C. Thus, wiring blocks can be connected to necessary all wirings between designated function al block of lower order and higher order block. It is to be noted that wiring blocks are arranged in space between corresponding upper end lower blocks.

By combination of circuits as described above, programming of connections of all signals and/or buses between objective functional blocks can be made.

Figure 8:
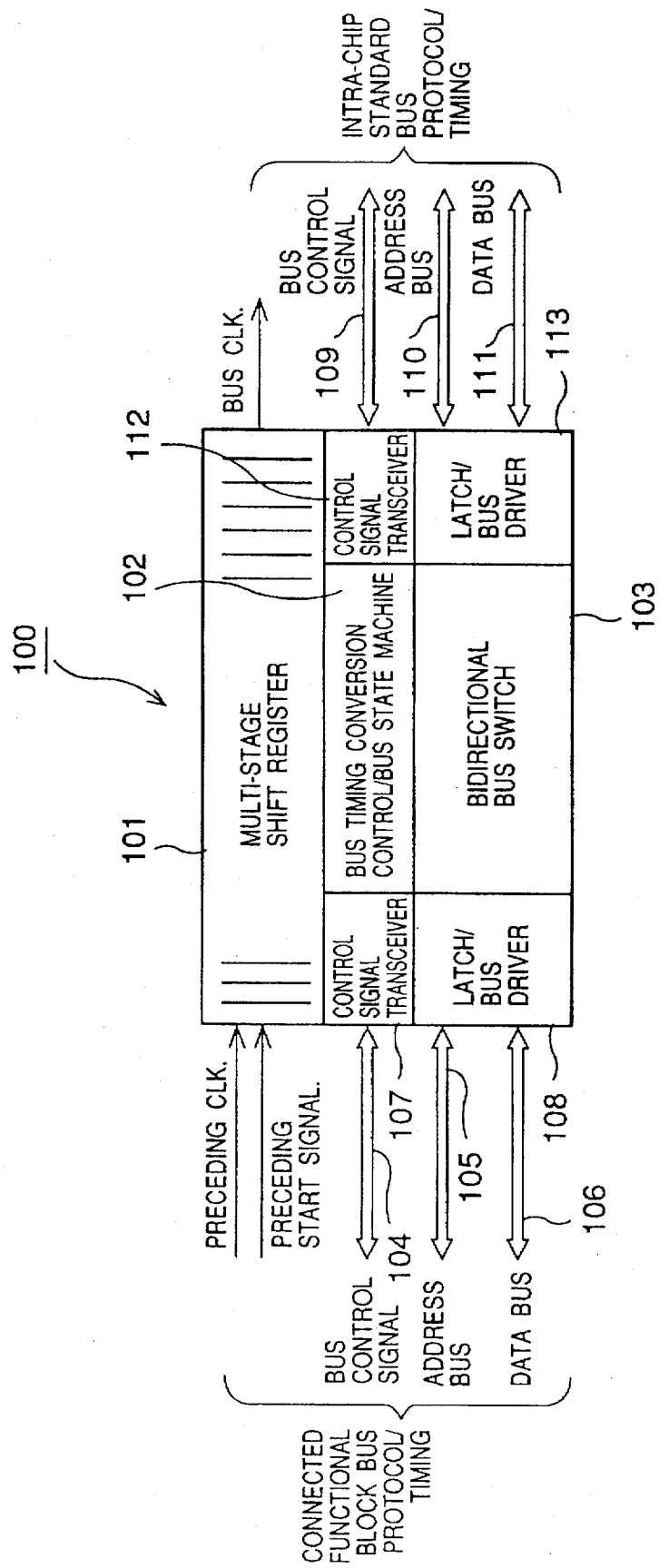
FIG. 8 is a circuit block diagram showing an embodiment of a bus protocol conversion circuit.

FIG. 8 shows bus protocol conversion circuit 100 necessary in connecting functional blocks peculiarly designed having no standard bus protocol and/or timing within chip.

This bus protocol conversion circuit 100 includes multistage shift register 101 responsive to preceding clock signal (frequency twice to several times greater than that of bus clock) and preceding start signal before different bus cycle is started to generate time train (bus clock) for conversion of bus timing to output the bus clock, and is operative to readjust (rearrange) block where maximum delay takes place so that it is located at the origin with preceding clock determined by the system being as reference to provide matching of timings and procedures of addresses, data and control signals. This circuit is suitable in the case where CPUS of different bus standards are connected to each other to allow data to be common therebetween. There is high possibility that such plural kinds of CPUs may be used in the field of multimedia where there is a tendency that individual CPUs are developed in every direction.

It should be noted that the necessary condition of the standard bus protocol is that initially maximum address is defined as address bus and maximum width is defined as data bus, and these control buses output data earlier than write signal at the time of write operation and precedingly outputs read-out signal at the time of read-out operation.

Referring to FIG. 8 for a second time, this circuit serves to temporarily store, into bus state machine 102, bus protocol/timing of functional block to be connected given by bus control signals line 104, address bus 105, data bus 106 to read out it at timing of bus state machine corresponding to protocol/timing of standard bus within chip to thereby convert bus protocol/timing to output it to bus control signal line 109, address bus 110, data bus 111. Namely, by setting preceding start time sufficiently prior to both bus protocols/ timings, they can march with each other. For these inputs/ outputs, control signal transceivers 107, 112, latch/bus drivers 108, 113 are provided.

It is to be noted in the case where address width of address bus and data width of data bus at bus to be connected and those within chip are different from each other, those widths are converted into bit widths determined within chip. In this case, bidirectional bus switch 103 is used to fill high order bits when width is narrow, and to adjust them to standard width when width is broad to output (send) them at a plurality of cycles.

Organizing means of 1 level as described above are connected to functional block group of lower level by using inter-block wiring generation programmable wiring mechanism BPWM as shown in the entire configuration of FIG. 1. It should be noted that functional blocks which have actual results may be fixedly wired in advance as partial circuit all at respective levels.

Figure 9:
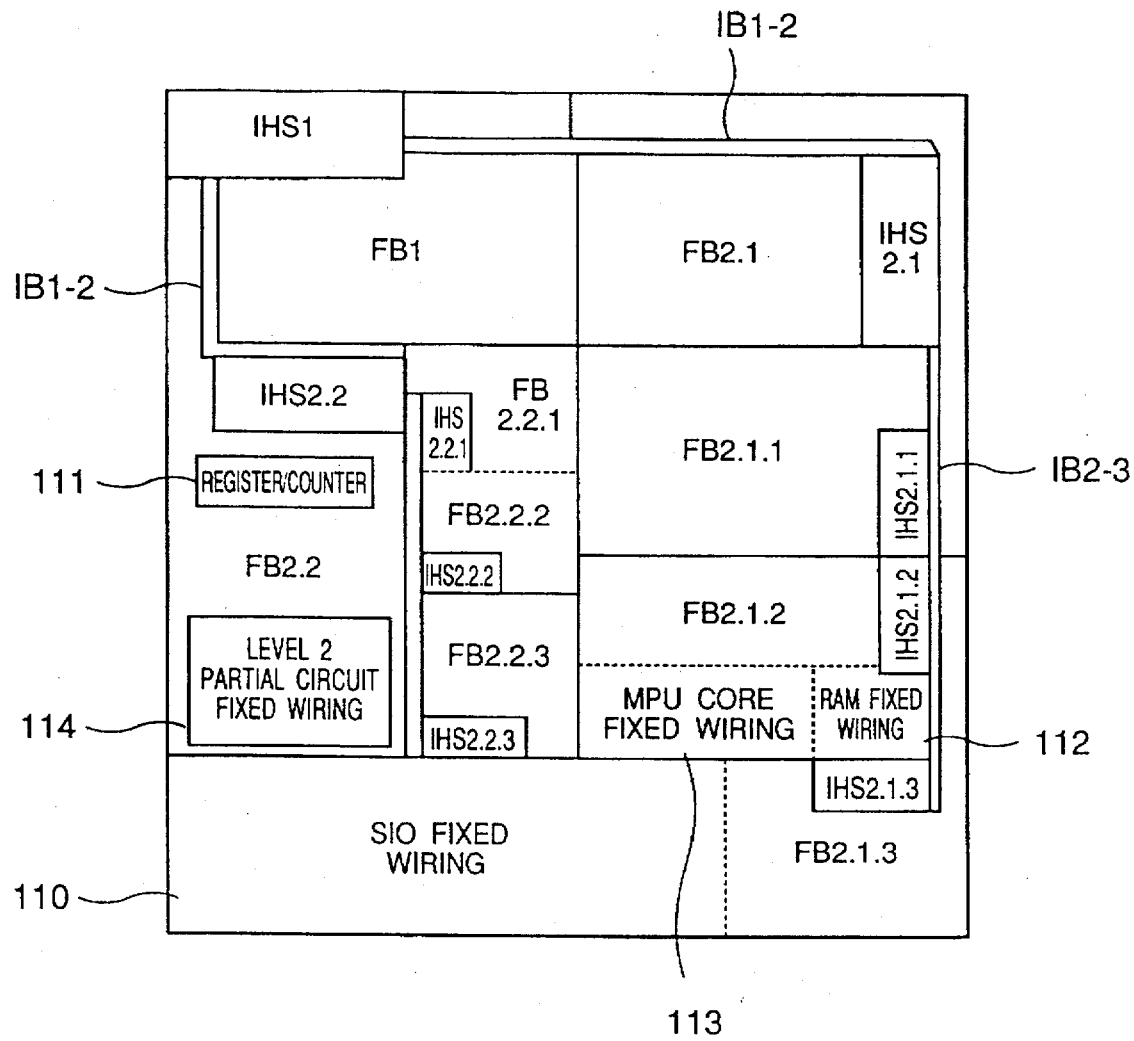
FIG. 9 is a block diagram showing an example of arrangement of inheritance circuits in the entirety of chip.

FIG. 9 shows an example where inheritance circuits of respective levels are actually arranged through function inheritance information read-out bus in a hierarchical manner on chip. It is clear from this example shown in FIG. 9 that reservation areas are ensured with respect to functional blocks FB of respective levels, and there is formed a hierarchical structure such that inheritance circuit IHS1 of the highest level (first level) is successively connected, by functional inheritance information read-out buses, to inheritance circuits IHS2.1 and 2.2 of level 2 and inheritance circuits 1HS2.2.1, 2.1.2, 2.2.1, 2.2.2, 2.2.3. It should be noted that function inheritance information read-out buses are represented such that, e.g., function inheritance information read-out bus connected between levels 1 and 2 is labeled IB1-2.

In the example of FIG. 9, wirings are respectively carried out with respect to register/counter 111 as the partial circuit of level 2, partial circuit 114 and MPU core 113 of level 2, and communication controller (SIO) portion 110 as partial circuit of level 3. Intra-block circuit connection information with respect such areas are taken out from respective libraries.

It is to be noted that since the above-described respective elements have extremely good compatibility with CAD for VLSI design, it is desirable that those elements are used to make a design.

Figure 10:
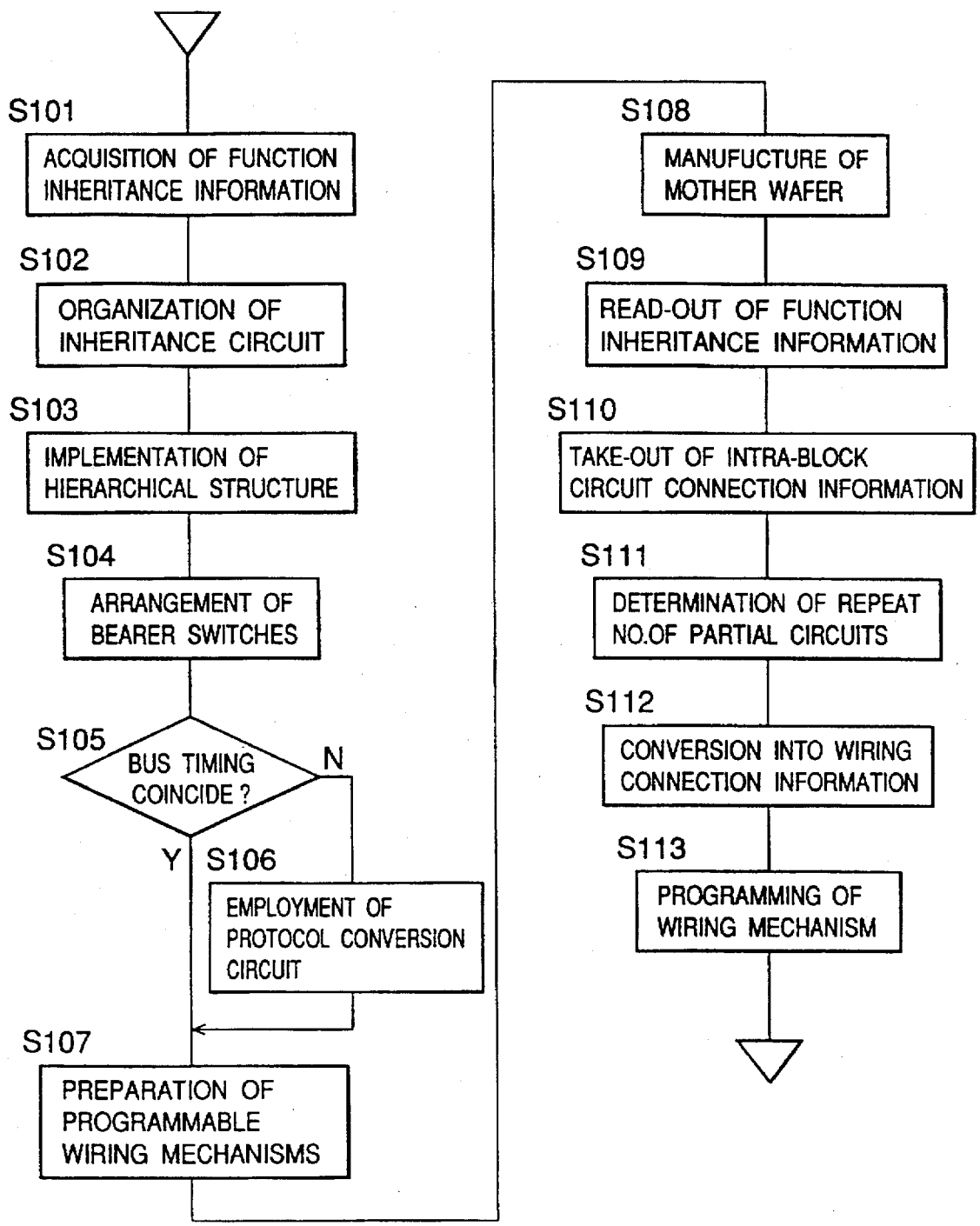
FIG. 10 flowchart showing a method of organizing an application specific integrated circuit according to this invention.
Figure 11:
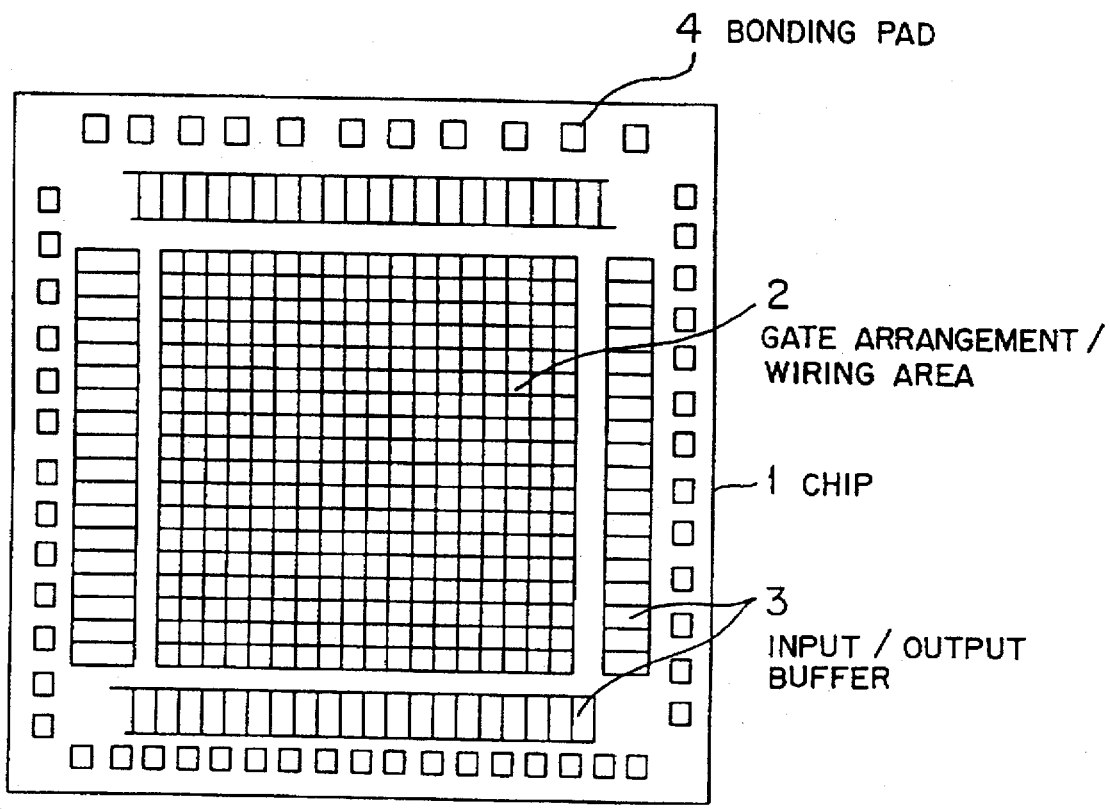
FIG. 11 is an explanatory view of an example of conventional gate array circuit configuration.
Figure 12:
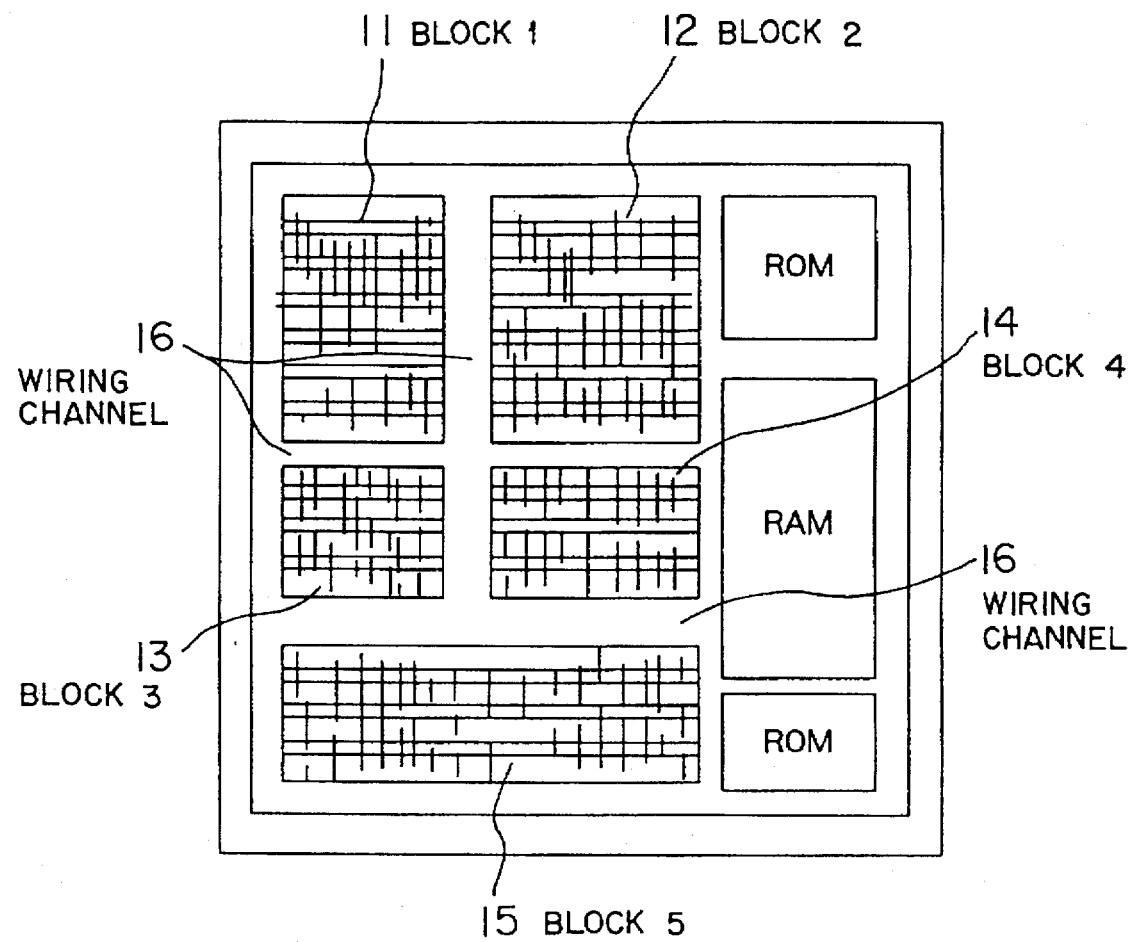
FIG. 12 is an explanatory view of an example of conventional standard cell circuit configuration.
Figure 13:
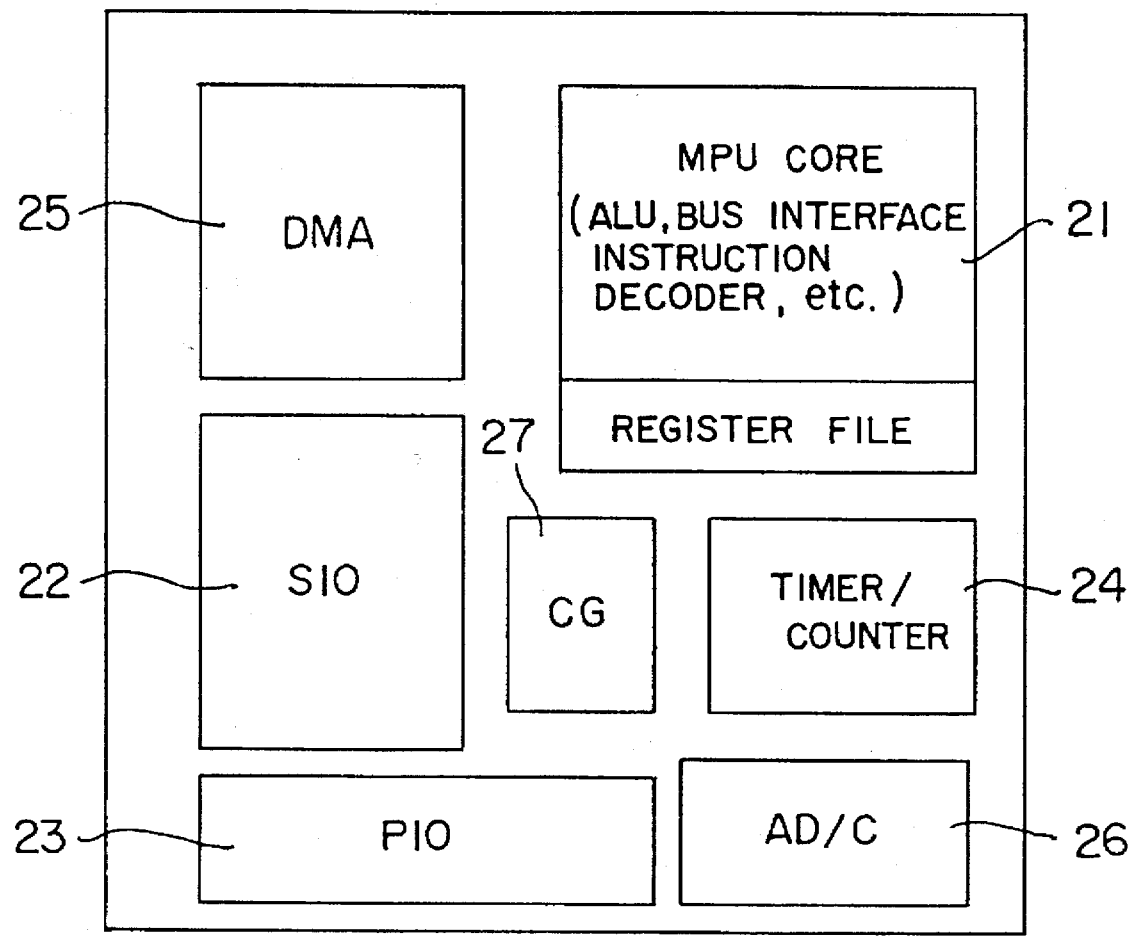
FIG. 13 is an explanatory view of an example of circuit configuration by re-utilization of the conventional existing chip mark patterning.
Figure 14:
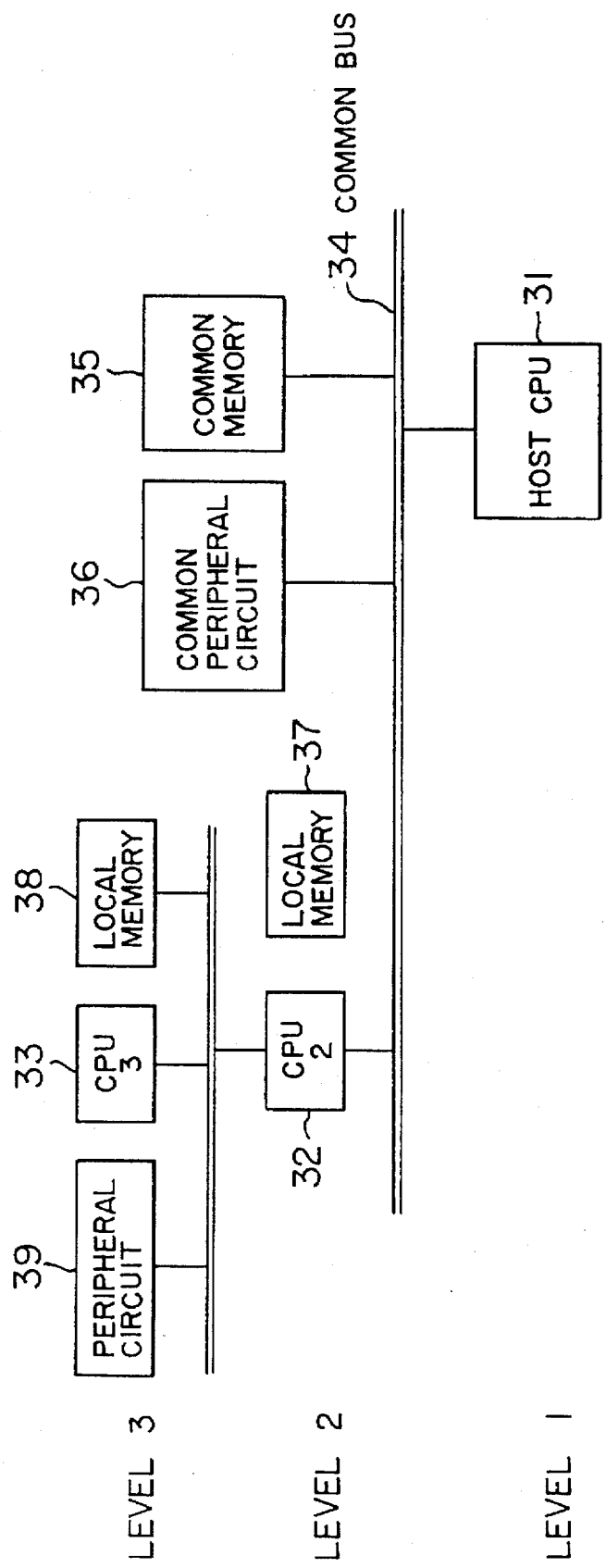
FIG. 14 is an explanatory view of an example of the configuration by conventional CPU block multi-stage connecting system.

Application specific integrated circuit according to this invention can be realized through process steps as described below. Explanation will be given in accordance with the flowchart of FIG. 10.

(1) Initially, in order to obtain a desired microcontroller, function inheritance information consisting of external function and internal circuit configuration template of designed and verified MPU core which has been verified through trial manufacture, evaluation and application, or peripheral input/ output controller function block prepared in advance is acquired (obtained) (step S101). This information is fixed into ROM to thereby obtain inheritance circuits (step S102) to assemble a plurality of inheritance circuits through function inheritance information read-out bus on the basis of the system requirement specification so that they are of a necessary hierarchical structure (step S103).

(2) Then, bearer switches for generating paths for main data and control signals passing from external input terminal group to external output terminal group through respective blocks which execute system requirement specification are arranged at necessary portions (step S104).

(3) Whether or not accessing systems and timings of blocks existing in function block library coincide with each other is examined (step S105). In the case where they coincide with each other, the processing operation proceeds to the subsequent step as it is. In contrast, in the case where they do not coincide with each other, necessary number of bus protocol conversion circuits for carrying out conversion into standard bus protocol are employed (step S106).

(4) Further, programmable wiring mechanisms for forming detailed connection points thereof are prepared the number corresponding to all terminals where connection can be made (step S107).

(5) Mother wafer on which circuits obtained by the above-described steps (1) to (3) is manufactured (step S108).

(6) Then, the following programming is carried out in order to specify derivative parts.

(a) Function inheritance information are read out from respective inheritance circuits through function inheritance information read-out bus (step S109).

(b) Intra-block circuit connection information is taken out from library of registered functional block such as MPU core, peripheral input/output controller functional block, etc. corresponding to the read out function inheritance information (step S110).

(c) Further, system requirement specification and block internal configuration template information included in function inheritance information of respective corresponding functional blocks are used to determine the number of repeat times of the constituent partial circuit (e.g., address register, etc. of DMA block) (step S111).

(d) Conversion into wiring connection information with respect to programmable wiring mechanism is made on the basis of the read-out judgment work (step S112).

(e) Mother wafer is caused to be in programming mode to connect, at necessary portions, elements serving as connection points assembled in programmable wiring mechanism by using wiring connection information (step S113).

(7) Further, wish a view to reducing chip size and current consumption, with respect to partial circuit blocks which are used in respective circuit blocks only for a fixed time period end are not required to be fixedly occupied, e.g., register group, counter group, FIFO group, etc., it is possible so avoid competition from plural blocks by using reservation circuits.

This reservation circuit is a circuit for allowing high order block commonly held with respect to a plurality of function blocks of lower order to gave a function of occupation thereof. In the case where a plurality of the same circuits are used, those plural circuits are collected at the same portion, and to allow circuits which are not simultaneously used to be independent to thereby increase in circuit scale. Thus, efficiency is improved.

Accordingly, such option circuit dynamically operates when LSI is used.

It should be noted that the configuration of partial circuit and/or block itself may be fixedly wired. Thus, programming time can be still more shortened and security of important information can be improved.

The application specific integrated circuit made up in this way has the following features.

(1) Since dedicated functional blocks which have actual design/manufacture results are selected from library and such selected blocks are employed, increase in the development term and/or cost of customer which is of the question in the circuit organizing method for gate array or standard cell can be prevented.

(2) Since functional block attributes and/or actual circuits are all uniquely indicated by inheritance circuits, there is no possibility that this application specific integrated circuit does not directly undergo restriction on physical mask pattern of the existing chip. Accordingly, block selection and chip layout corresponding to the system request can be made.

(3) Hitherto, in the case where CPU block having no dedicated function is connected in advance, system application specific data/program is caused to be in the form of down load. Although flexibility is infinite, maintenance is extremely difficult. On the contrary, in accordance with this embodiment, since functional blocks arranged on the chip have fixed function inheritance information, circuit generation is correctly carried out. In addition, since rewrite operation cannot be carried out after wiring programming, system runaway can be avoided.

(4) In the case where a wide variety of application equipments from customer are developed in a short time period, if several tens of mother wafers of application specific standard products are prepared, it is possible to manufacture relatively many kinds of derivative variations even with lesser wiring programming.

(5) Also in the case where ASIC microcomputers are developed for application equipments in the entirely new field, it is possible to systematically make a design of designed/manufacture functional blocks which have actual results prepared in CAD library and newly developed functional blocks in the state where they are mixed. Even in the case where such newly developed functional blocks are used, it is possible to re-utilize partial circuits such as register, counter, FIFO or data selector, etc. by fixed wiring. Accordingly, even in this case, it is possible to trial manufacture new products only by programming of mother wafer at a relatively higher ratio.

As is clear from the foregoing description, in accordance with the application specific integrated circuit and the organizing method therefor according to this invention, since connections of functional blocks caused to be of hierarchical structure are carried out on the basis of function inheritance information of respective functional blocks, wide variety of products can be developed in a short time period.

What is claimed is:

1. An application specific integrated circuit comprising:
   a plurality of functional blocks, each functional block having an inheritance circuit therein, the inheritance circuit being operative to transfer function inheritance information of a selected functional block of a hierarchically lower level to which data is transferred from the functional block of the hierarchically lower level or function inheritance information of the selected functional block with respect to functional inheritance information required for univocally specifying functions of the functional blocks, each functional block having a plurality of functional block portion circuits which are used to execute a portion of an inherent function of the functional block;
   inheritance buses for connecting the inheritance circuits disposed in a hierarchical structure to thereby read out function inheritance information from an arbitrary functional block;
   data transfer switch means provided at respective functional blocks and adapted for generating connections of data buses and bus control signal lines between functional blocks of lower and higher levels; and
   programmable wiring mechanisms for determining the number of repeat times at said functional block portion circuits and wirings between the inheritance circuits, the functional blocks and the data transfer switch means on the basis of the function inheritance information and system configuration information request externally provided.

2. An application specific integrated circuit as set forth in claim 1, which further comprises a bus protocol conversion circuit for carrying out matching between functional blocks having different address/data widths and bus control procedures.

3. An application specific integrated circuit as set forth in claim 1, which further comprises reservation circuits for connecting, only for a necessary time period, functional block portion circuits occupied by said functional blocks only for a fixed time period.

4. An application specific integrated circuit as set forth in claim 1, wherein the inheritance circuit includes memory means for fixedly storing the function inheritance information of the corresponding functional block.

5. A method for organizing an application specific integrated circuit comprising the process steps of:
   obtaining function inheritance information including external functions and internal circuit configuration templates of MPU cores or peripheral input/output controller function blocks verified by an existing design to provide inheritance circuits fixed in ROMs;
   assembling the inheritance circuits through inheritance buses on the basis of a system requirement specification so that the inheritance circuits form a hierarchical structure;
   disposing, at necessary portions, data transfer switch means for generating paths for transferring main data and control signals passing from external input terminal groups for receiving data to be executed by said MPU core to external output terminal groups for outputting executing results by said MPU core through the input/output controller function blocks for executing the system requirement specification;
   preparing programmable wiring mechanism for forming detailed connection points corresponding to terminals where connections are capable of being made;
   disposing circuits prepared by the preceding process steps to manufacture a mother wafer;
   reading out function inheritance information from respective inheritance circuits through inheritance buses;
   taking out intra-block circuit connection information corresponding to readout function inheritance information from a library of registered functional blocks;
   determining the number of repeats of constituent partial circuits by using the system requirement specification and block internal configuration template information included in function inheritance information or respective corresponding functional blocks;
   converting information obtained at preceding process steps into wiring connection information with respect to the programmable wiring mechanisms;
   connecting, at necessary portions, elements serving as connection points assembled in the programmable wiring mechanisms by using the converted wiring connection information; and employing a necessary number of bus protocol conversion circuits for carrying out conversion into standard bus protocol in a case where bus accessing systems and/or timings of respective blocks existing in the functional block library do not coincide with each other.

6. A method of organizing an application specific integrated circuit as set forth in claim 5, which further comprises a process step of disposing reservation circuits at least with respect to partial circuit blocks which are used for respective circuit blocks only for a fixed time period and are not required to be fixedly occupied.

* * * * *